(12) United States Patent
Taguchi et al.

(10) Patent No.: US 8,400,107 B2
(45) Date of Patent: Mar. 19, 2013

(54) CHARGE STATUS DISPLAY APPARATUS AND ELECTRIC POWER SUPPLY CONTROL APPARATUS

(75) Inventors: Shinya Taguchi, Kariya (JP); Hiroshige Asada, Nagoya (JP); Takashi Kanamori, Nagoya (JP)

(73) Assignee: DENSO CORPORATION, Kariya (JP)

(*) Notice: Subject to any disclaimer, the term of this patent is extended or adjusted under 35 U.S.C. 154(b) by 388 days.

(21) Appl. No.: 12/923,152

(22) Filed: Sep. 7, 2010

(65) Prior Publication Data
US 2011/0057613 A1    Mar. 10, 2011

(30) Foreign Application Priority Data
Sep. 8, 2009  (JP) .................. 2009-206996

(51) Int. Cl.
H01M 10/46    (2006.01)
(52) U.S. Cl. ..................................................... 320/109
(58) Field of Classification Search .................. 320/104, 320/107, 109, 132, 149; 701/22, 29.1, 29.3, 701/FOR. 103; 340/635, 636.1
See application file for complete search history.

(56) References Cited

U.S. PATENT DOCUMENTS

| | | | |
|---|---|---|---|
| 7,103,460 B1* | 9/2006 | Breed | 701/32.9 |
| 7,421,321 B2* | 9/2008 | Breed et al. | 701/33.6 |
| 2010/0106631 A1 | 4/2010 | Kurayama et al. | |
| 2010/0226495 A1* | 9/2010 | Kelly et al. | 380/30 |

FOREIGN PATENT DOCUMENTS

| | | |
|---|---|---|
| EP | 2 110 923 | 10/2009 |
| JP | A-2001-359203 | 12/2001 |
| JP | A-2005-198445 | 7/2005 |
| WO | WO 2009/090813 | 7/2009 |

* cited by examiner

*Primary Examiner* — Edward Tso
(74) *Attorney, Agent, or Firm* — Posz Law Group, PLC

(57) ABSTRACT

When a user performs a short-press manipulation to A button or B button, a vehicle ID associated with either A button or B button having received the short-press manipulation is specified based on a button-vehicle correspondence table. Charge status information of a battery of a vehicle corresponding to the above associated vehicle ID is acquired from the vehicle. Thereby, the display device displays the acquired charge status information or the electric power supply is started to the battery of the vehicle corresponding to the vehicle ID.

9 Claims, 10 Drawing Sheets

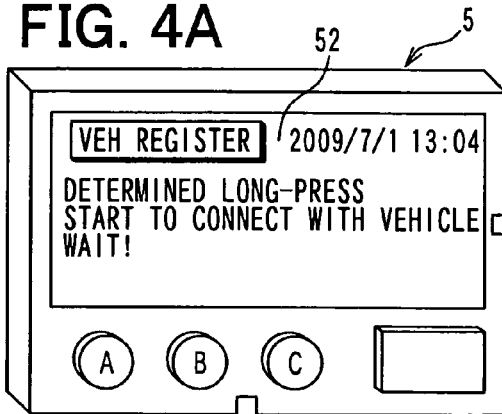
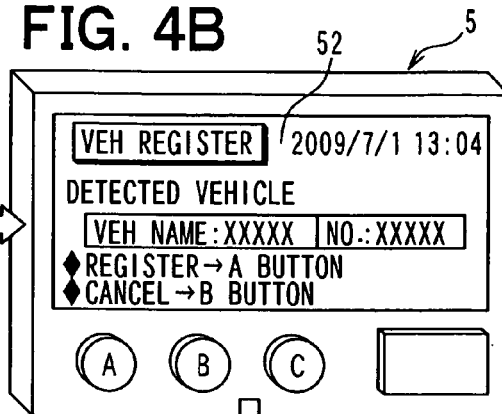
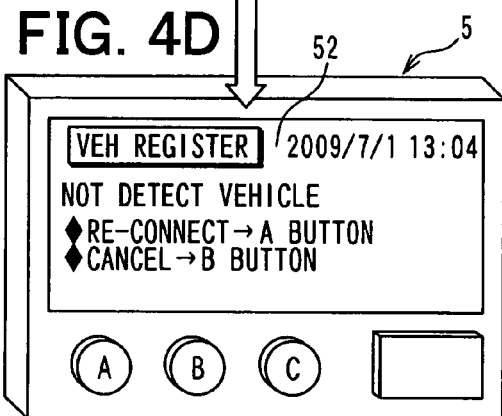
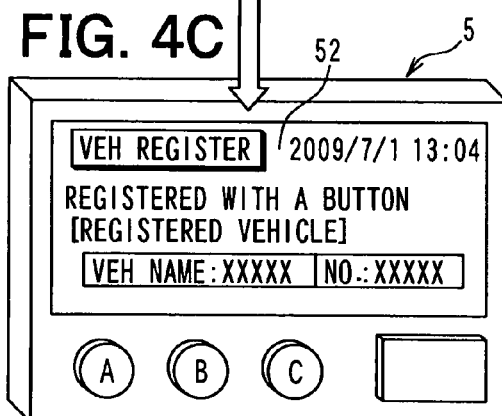
FIG. 5
| BUTTON NO | VEH ID |
|---|---|
| A | 12345 – 6789 |
| B | |
FIG. 6
| BUTTON NO | VEH ID |
|---|---|
| A | 12345 – 6789 |
| B | 12345 – 0000 |

| PORT NO | VEH ID |
|---|---|
| 1 | 12345-0000 |
| 2 | |

FIG. 11A
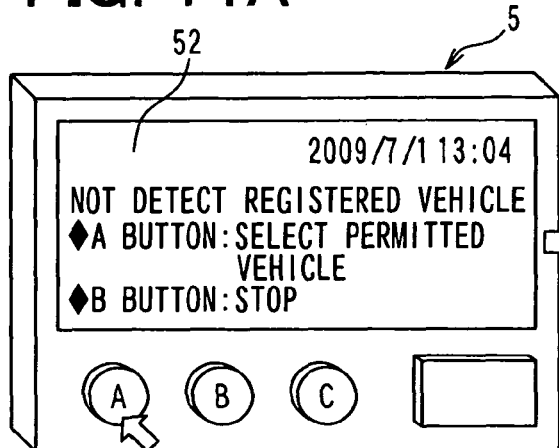
FIG. 11B
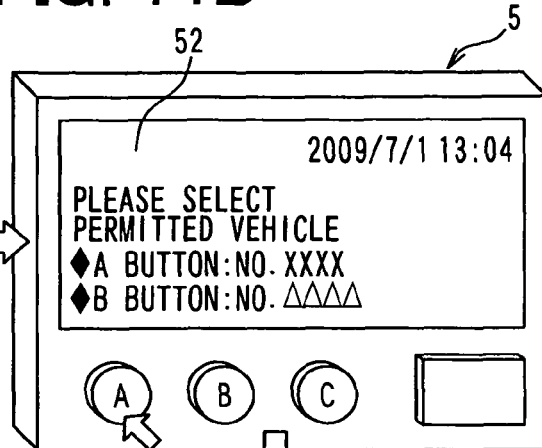
FIG. 11D
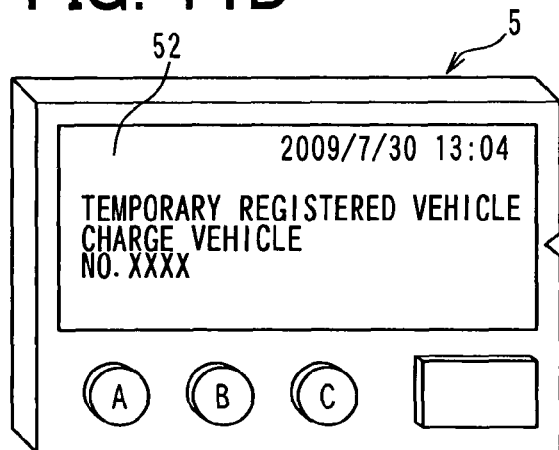
FIG. 11C
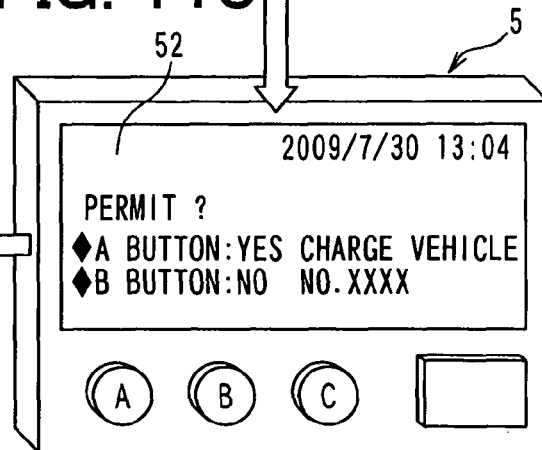
FIG. 12
| DAY (MMDD) | ELECTRICITY (kWh) | FEE (YEN) |
|---|---|---|
| 0701 | 30 | 300 |
| 0702 | 15 | 150 |
| 0703 | 10 | 100 |
| 0705 | 30 | 300 |
| ... | | |
| 0729 | 10 | 100 |
| 0730 | 10 | 100 |
| 0713 | 30 | 300 |

CHARGE STATUS DISPLAY APPARATUS AND ELECTRIC POWER SUPPLY CONTROL APPARATUS

CROSS REFERENCE TO RELATED APPLICATION

The present application is based on and incorporates herein by reference Japanese Patent Application No. 2009-206996 filed on Sep. 8, 2009.

FIELD OF THE INVENTION

The present invention relates to a charge status display apparatus and an electric power supply control apparatus.

BACKGROUND OF THE INVENTION

[Patent document 1] JP-2008-199752 A (EP-2,110,923 A1)

There is known a technology of an electric power supply system in which several charge terminals are arranged in a parking lot such that a vehicle is connected with each charge terminal. Further, each charge terminal supplies a battery of the connected vehicle with an electric power from a commercial power source.

For example, in a technology described in Patent document 1, when a manipulation device (panel) of one charge terminal (charge manipulation device) is manipulated, the power supply begins from the charge terminal to the battery of the vehicle.

Such a manipulation device may be arranged in a position (for example, indoor) distant from the charge terminal in the future. In such a case, after reviewing, the inventors have found out a problem that does not usually occur.

That is, in a prior art, when a user manipulates a charge terminal connected with an intended vehicle as a target of an electric power supply, the charge to the intended vehicle can be certainly realized. In contrast, when a charge terminal is arranged in a position distant from a manipulation device, the correspondence between one of several charge terminals and one of several manipulation devices cannot easily determined. A user may thus manipulate an unintended manipulation device, thereby causing a possibility of executing an electric power supply to another vehicle, which is connected to an unintended charge terminal different from the intended one.

In addition, even if the correspondence relation between the charge terminal and the manipulation device is clear, there may be a case that the manipulation device is separated from the charge terminal. Such a case may cause a possibility for a user to be unable to see which charge terminal an intended vehicle is connected with, from a position of the manipulation device. In this case, when forgetting which charge terminal the vehicle is connected with, the user may thus manipulate an unintended manipulation device, thereby similarly causing a possibility of executing an electric power supply to another vehicle, which is connected to an unintended charge terminal different from the intended one.

Such a problem is not restricted to the case that the manipulation device is used for controlling an electric power supply. For example, the similar problem may be caused in cases that a manipulation device is arranged at a position distant from a charge terminal and manipulating of the manipulation device enables a display of a charge status of a battery. That is, a user may thus manipulate an unintended manipulation device, thereby causing a possibility of displaying a charge status of a battery of another vehicle, which is connected to an unintended charge terminal different from the intended one.

SUMMARY OF THE INVENTION

The present invention takes the above problem into consideration. It is an object of the present invention to reduce a possibility that a user mistakenly manipulates a wrong manipulation device in an electric power supply system, thereby starting an electric power supply control or a charge status display with respect to an unintended vehicle battery. Herein, the electric power supply system is provided with several manipulation devices, which are arranged in positions distant from several charge terminals.

To achieve the above object, according to an example of the present invention, a charge status display apparatus is provided for displaying a charge status of a battery of a vehicle, which is connected with one of a plurality of charge terminals, at a position distant from the charge terminals. Herein, each charge terminal is allowed to be connected with only one vehicle at one time; the each charge terminal supplies an electric power to the connected only one vehicle. The charge status display apparatus is provided by comprising the followings: a plurality of manipulation sections configured to receive a manipulation by a user; a read-out section configured to read a correspondence table, which associates one of the manipulation sections with a vehicle ID, from a storage medium; a vehicle specification section configured to specify a vehicle. ID associated with a first manipulation section out of the manipulation sections in the correspondence table, in a condition that the first manipulation section receives a first manipulation; an acquisition section configured to acquire charge status information on a charge status of a battery from a vehicle corresponding to the vehicle ID specified by the vehicle specification section out of vehicles, each of which connected with one of the charge terminals; and a display control section configured to cause a display section to display the charge status information acquired by the acquisition section.

Under such a configuration, when the user executes a first manipulation to a first manipulation section, a vehicle ID associated with the first manipulation section in the correspondence table is specified. Charge status information of a battery in a vehicle corresponding to the associated vehicle ID is acquired from the vehicle and displayed in the display device.

Thus, even if an intended vehicle is connected to any of the charge terminals, when the first manipulation section undergoes the first manipulation, the charge status of the intended vehicle associated with the first manipulation section can be displayed. Further, if at least the user remembers that the intended vehicle is associated with the first manipulation section, the user can certainly confirm the charge status of the intended vehicle without needing to be conscious of which charge terminal the intended vehicle is connected with. That is, such a configuration can decrease a possibility that a user mistakenly executes a manipulation to a wrong manipulation section to thereby display a charge status of a battery of an unintended vehicle.

According to another example of the present invention, an electric power supply control apparatus is provided for controlling an electric power supply to a battery of a vehicle, which is connected with one of a plurality of charge terminals, at a position distant from the charge terminals. Herein, each charge terminal is allowed to be connected with only one vehicle at one time. The each charge terminal supplies an electric power to the connected only one vehicle. The electric power supply control apparatus is provided by comprising: a plurality of manipulation sections configured to receive a manipulation by a user; a read-out section configured to read a correspondence table, which associates one of the manipulation sections with a vehicle ID, from a storage medium; a vehicle specification section configured to specify a vehicle ID associated with a first manipulation section out of the manipulation sections in the correspondence table, in a condition that the first manipulation section receives a first manipulation; a terminal specification section configured to specify, out of the charge terminals, a charge terminal which the vehicle specified by the vehicle specification section is connected with; and an electric power supply start section configured to control such that an electric power supply is started in the charge terminal specified by the terminal specification section.

Under such a configuration, when the user connects a vehicle to a charge terminal and executes a first manipulation to a first manipulation section, a vehicle, which is associated with the first manipulation section is specified based on the correspondence table. Further, a charge terminal to which the vehicle is connected is specified. The specified charge terminal is controlled such that an electric power supply is started.

Thus, even if an intended vehicle is connected to any of the charge terminals, as long as at least the user keeps in remembrance the association of the vehicle with the first manipulation section, without need of concerning a charge terminal the vehicle is connected with, the start and stop of the charge of a battery of the vehicle are certainly controllable. That is, such a configuration can decrease a possibility that a user mistakenly executes a manipulation to a wrong manipulation section to thereby display a charge status of a battery of an unintended vehicle.

BRIEF DESCRIPTION OF THE DRAWINGS

The above and other objects, features, and advantages of the present invention will become more apparent from the following detailed description made with reference to the accompanying drawings. In the drawings:

FIG. 4A to 4D are diagrams illustrating display contents in the controller in the registration process;

FIG. 5 is a diagram illustrating a correspondence table between a button and a vehicle in a storage device of the controller;

FIG. 6 is a diagram illustrating a correspondence table between a button and a vehicle in a storage device of the controller;

FIGS. 11A to 11D are diagrams illustrating examples of displays in cases that any vehicle associated with a short-press manipulated button is not connected;

FIG. 12 is a diagram illustrating travel history data;

DETAILED DESCRIPTION OF THE PREFERRED EMBODIMENTS

First Embodiment

Figure 1:
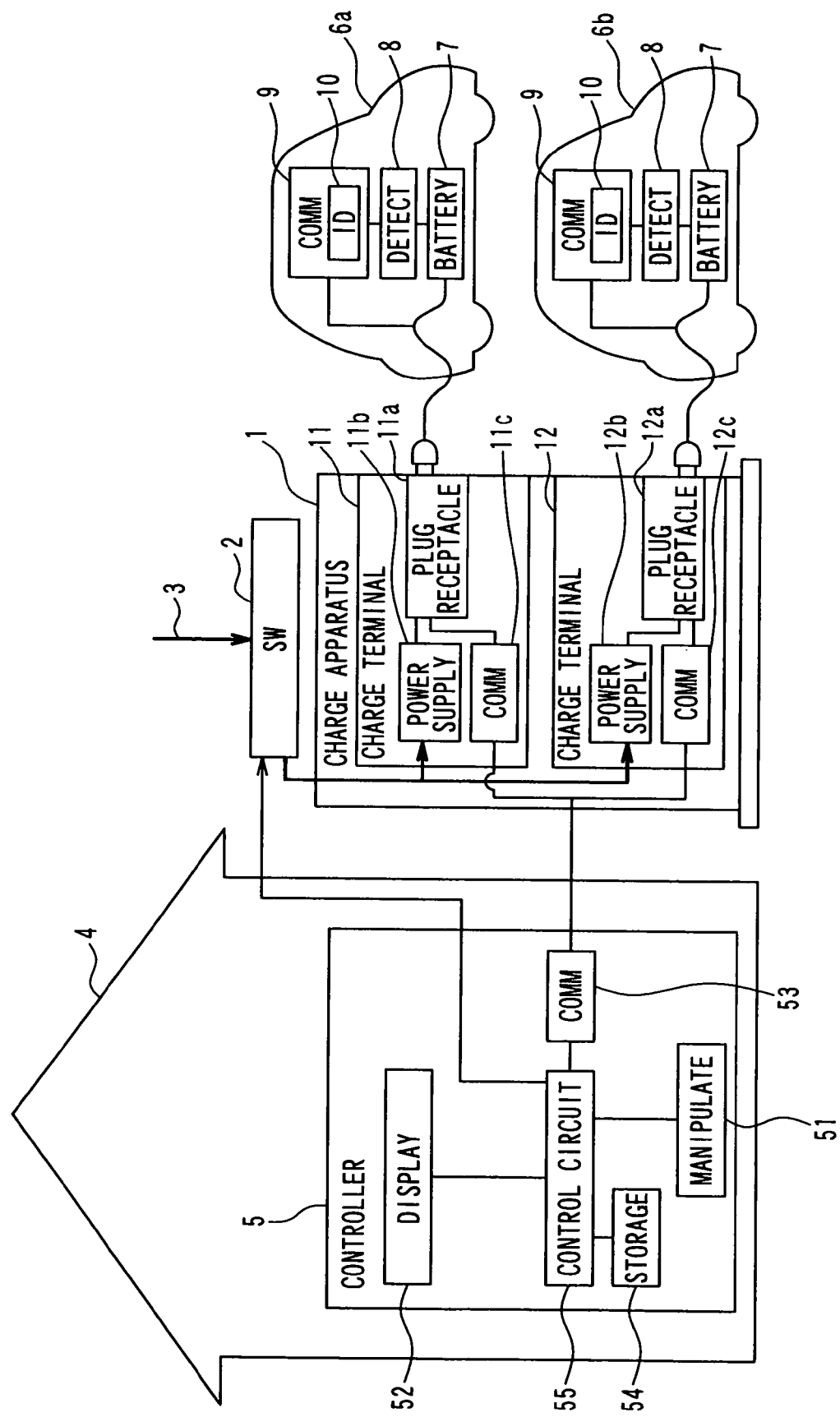
FIG. 1 is a diagram illustrating an overall configuration of an electric power supply system according to a first embodiment of the present invention.

The following describes a first embodiment of the present invention. As illustrated in FIG. 1, an electric power supply system for home use according to the present first embodiment includes the following: a charge apparatus 1 (also referred to as a charger), a switch device 2, a controller 5 (also serving as an example of a charge status display apparatus) in a building 4 such as a house, and plug-in charge vehicles 6a, 6b, each of which is connected with the charge apparatus 1 and then receives charge (i.e., electric power supply).

Each subject vehicle, i.e., each of the vehicles 6a, 6b, includes a battery 7 serving as a rechargeable battery (i.e., secondary battery) which is able to be repeatedly charged, i.e., which can receive the charge repeatedly; a detection device 8 which detects a charge status of the battery 7; and a communications device 9 to communicate with the charge apparatus 1 as a connection destination. The charge status of the battery 7 is represented by a charge level [%] etc. which illustrates a ratio of the present electricity accumulation amount to the full charge amount.

The battery 7 can accumulate an electrical power amount of 8 kWh to 16 kWh at a maximum. The electric power accumulated in the battery 7 is used by the vehicle 6a, 6b as a running energy. In detail, the vehicle 6a, 6b drives a motor (unshown) using the electric power of the battery 7 as energy, and runs with a driving force of the motor. Such a vehicle which runs using the electric power stored in the battery 7 as an energy source includes, for instance, a known electric vehicle (EV) and plug-in hybrid vehicle (PHV). The electric vehicle can run only using the driving force of the motor driven with the electric power stored in the battery 7. The hybrid vehicle can run using (i) the driving force of the motor driven with the electric power stored in the battery 7 and (ii) the driving force of an internal-combustion engine.

The communications device 9 has an ID storage device 10 which stores vehicle information on the subject vehicle. The vehicle information of the subject vehicle contains a vehicle name, a number of the license plate, a vehicle ID, etc. The vehicle ID is information for identifying the subject vehicle uniquely. The communications device 9 communicates with a charge apparatus 1 by power line communications (PLC) using a power cable which establishes the connection between the battery 7 and the charge apparatus 1. The communications device 9 can be realized using an electronic device equipped with a microcomputer, a PLC modem, etc.

The charge apparatus 1 is arranged distantly from the controller 5, for instance, in a parking lot for parking the vehicle 6a, 6b. The charge apparatus 1 receives an electric power for supply via the switch device 2 and supply the electric power to the vehicle 6a, 6b connected with the charge apparatus 1.

The charge apparatus 1 is provided with several charge terminals 11, 12 (in detail, two terminals in the present embodiment). Each charge terminal 11, 12 is designed to connect with only one vehicle at one time and supply an electric power to such only one vehicle. In detail, the charge terminal 11 has a plug receptacle 11a, an electric power supply device 11b, and a communications device 11c, whereas the charge terminal 12 has a plug receptacle 12a, an electric power supply device 12b, and a communications device 12c.

The plug receptacle 11a is designed such that one plug of a power cable for supplying an electric power to the battery 7 of the vehicle 6a, 6b can be inserted (i.e., plugged) into the plug receptacle 11a. The electric power supply device 11b is a circuit for supplying the vehicle 6a, 6b with the electric power received via the switch device 2 when the plug receptacle 11a connects with the one subject vehicle via the power cable.

The communications device 11c communicates with the communications device 9 of the vehicle connected to the plug receptacle 11a via the power cable while communicating with the controller 5 via the communications line or link. The communication with the communications device 9 of the vehicle uses the power line communications (PLC) via the power cable linked to the plug receptacle 11a. The communications device 11c can be realized using an electronic device including a microcomputer, a PLC modem, and a communications interface for communicating with the controller 5.

The configuration and the mutual relation of the plug receptacle 12a, the electric power supply device 12b, and the communications device 12c are the same as those of the plug receptacle 11a, the electric power supply device 11b, and the communications device 11c; thus, explanation is omitted for such devices.

The switch device 2 is arranged outside of the building 4. In order to supply the electric power for supply, the switch device 2 is connected with the power supply line 3 drawn from an outer commercial power source (for example, a transformer connected to the power line which an electric power company provides), and transforms an alternating current from the power supply line 3 into a direct current, thereby supplying each of the electric power supply device 11b and the electric power supply device 12b.

Based on the control from the controller 5, the switch device 2 can perform a switchover between the execution and the stop with respect to the electric power supply to the electric power supply device 11b, independently of performing a switchover between the execution and the stop with respect to the electric power supply to the electric power supply device 12b. It is noted, in the present first embodiment, that an electric power is always supplied to each of the electric power supply device 11b and the electric power supply device 12b from the switch device 2. The switch device 2 can be realized with a circuit which uses a well-known relay, for example.

The controller 5 is used for executing a display of a charge status of a vehicle, which is connected to the charge apparatus 1 and receives electric power supply. The controller 5 is provided with a manipulation device 51, a display device 52, a communications device 53, a storage device 54, and a control circuit 55. An outside view of the controller 5 is exemplified in FIG. 2.

Figure 2:
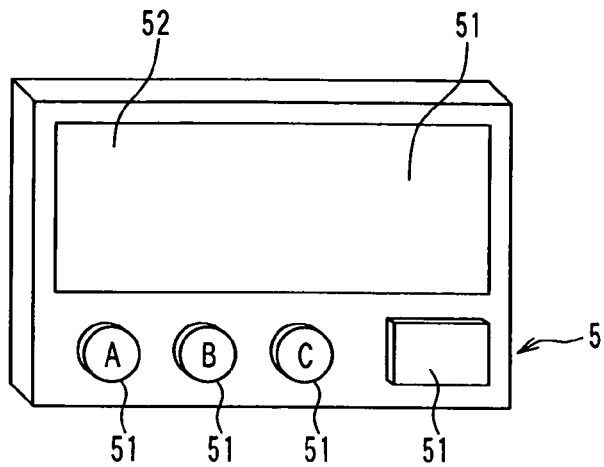
FIG. 2 is an outside view of a controller.

The manipulation device 51 receives a manipulation by a user of the electric power supply system and the subject vehicle 6a, 6b, and outputs to the control circuit 55 a signal indicating a content of the received manipulation. As illustrated in FIG. 2, the manipulation device 51 includes two or more manipulation means or sections, such as A button (i.e., A button switch), B button (i.e., A button switch), C button (i.e., C button switch), a power source ON-OFF switch, and a touch panel provided in a display device 52 in superimposition.

The display device 52 is a display unit (for example, liquid crystal display unit) which displays information for users using characters and images based on a control or instruction signal from the control circuit 55. The communications device 53 is for communicating with the communications devices 11c, 12c of the charge terminals 11, 12 via the communications line. The storage device 54 is a rewritable storage medium (for example, flash memory) for storing a variety of information.

The control circuit 55 is a microcomputer which has a CPU, RAM, ROM, etc. The CPU reads out a program from the ROM and into the RAM to execute, thereby realizing various processes. In the execution of the various processes, if needed, the control circuit 55 controls the switch device 2 and the display device 52, acquires a signal from the manipulation device 51, performs reading-out and writing of information with the storage device 54, and communicates using the power supply line 3. The communications partner includes the charge terminals 11, 12 and the vehicles 6a, 6b. The communications with each of the vehicles 6a, 6b are executed via each of the charge terminals 11, 12 to which each of the vehicles 6a, 6b is connected.

In the present embodiment, the control circuit 55 does not control the switch device 2, and the electric power is always supplied to the charge terminals 11, 12 via the switch device 2.

The following explains an operation of the electric power supply system. In the electric power supply system of the present embodiment, a vehicle ID is registered with the controller 5 with respect to each of the vehicles 6a, 6b which are often parked at the parking lot where the charge apparatus 1 is arranged. Based on the above registration of the vehicle ID, a vehicle ID of each of the vehicles 6a, 6b, and A button or B button of the manipulation device 51 are one-to-one associated with each other; information on the association is stored or recorded in the storage device 54.

The following explains an operation of the registration, which is executed by the control circuit 55. Although the explanation is made for the vehicle 6a, the contents of the operation are the same for the other vehicle 6b. First, the vehicle 6a is parked at the parking lot where the charge apparatus 1 is arranged. The user of the vehicle 6a connects the battery 7 of the vehicle 6a to either of the charge terminals 11, 12 using the power cable. It is premised that only the vehicle 6a is connected with the charge apparatus 1 at the present time. Then, the charge terminal of the connection destination begins to supply an electric power to the battery 7 via the power cable. The following explanation is made for the charge terminal 11 serving as the connection destination. Even if the charge terminal 12 serves as the connection destination, the contents of the operation are the same as those of the charge terminal 11.

Figure 3:
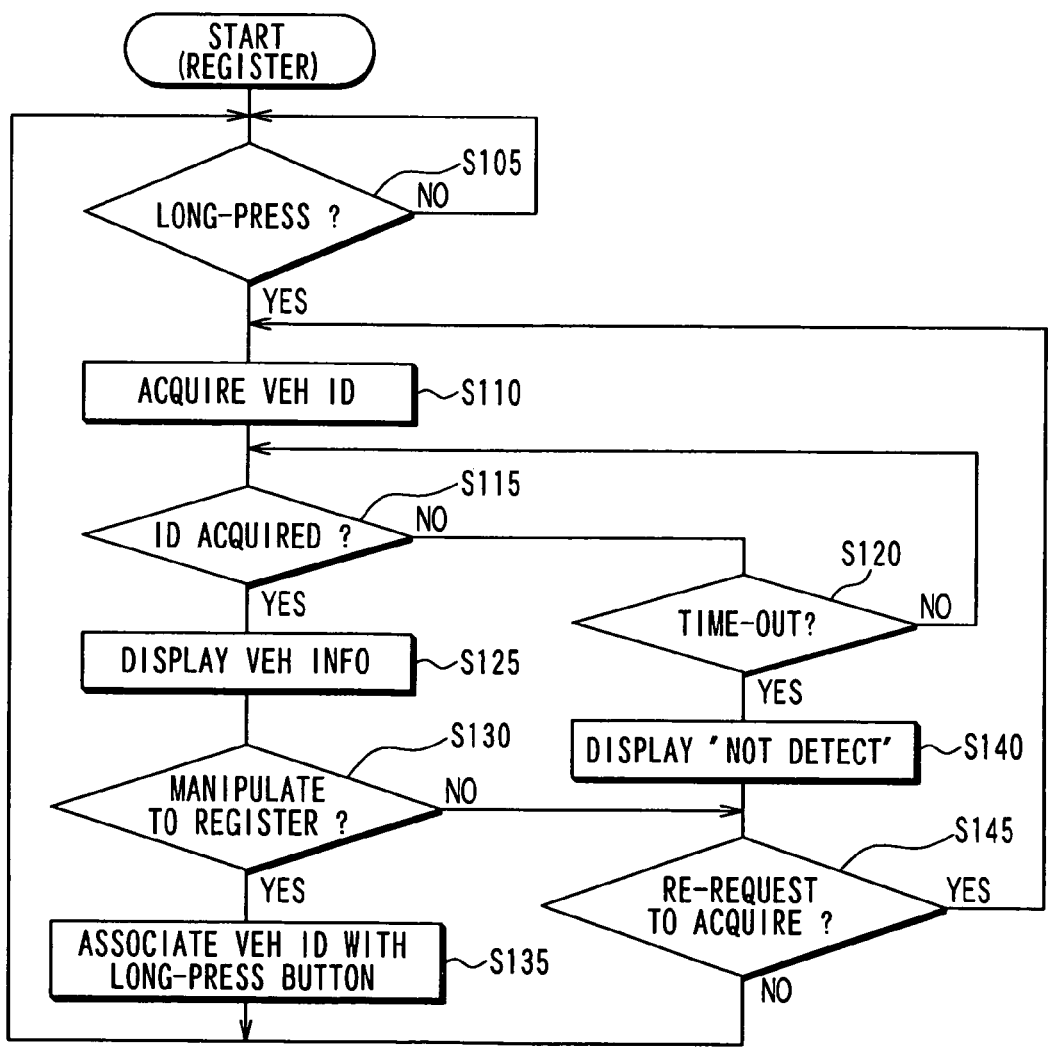
FIG. 3 is a flowchart of a registration process executed by the controller.

FIG. 3 illustrates a flowchart of the registration process which the control circuit 55 of the controller 5 always executes for registration of a vehicle. The control circuit 55 executes a predetermined program in the ROM, thereby realizing the registration process.

It is further noted that a flowchart or the processing of the flowchart in the present application includes sections (also referred to as steps), which are represented, for instance, as S105. Further, each section can be divided into several subsections while several sections can be combined into a single section. Furthermore, each of thus configured sections can be referred to as a means or unit and achieved not only as a software device but also as a hardware device.

After the vehicle 6a is connected with the charge terminal 11, the user of the vehicle 6a enters the building 4, and performs a long-press manipulation of A button or B button in the manipulation device 51 of the controller 5 for registration. The long-press manipulation signifies a long-time press manipulation to a button; the long time is defined as being a period longer or greater than a second reference period (for example, 3 seconds). In other words, the long-time press manipulation signifies continuing of pressing the button for a duration greater than the second reference period.

It is noted that A button or B button can receive, in a predetermined situation such as S105 in the registration process, several manipulations (i.e., several manipulation manners) such as a short-press manipulation (referred to as a first manipulation or a first manipulation manner), which will be explained later, and a long-press manipulation (referred to as a second manipulation or a second manipulation manner).

Then, at S105, the control circuit 55 determines that A button or B button receives or undergoes the long-press manipulation, then advancing the processing to S110. At S110, a message that the long-press manipulation of the button is executed, and a massage that the connection with the vehicle is started are displayed as illustrated in FIG. 4A.

Furthermore at S110, the acquisition of a vehicle ID is started. In detail, the control circuit 55 starts a process which performs repeatedly transmissions of an ID request signal which requests a vehicle ID to the charge terminal 11 and the charge terminal 12.

Subsequently, at S115, it is determined that the vehicle information is received from the charge terminal 11 or the charge terminal 12; otherwise, the processing waits until a predetermined timeout period (for example, 10 seconds) passes since the start of the acquisition start (S120).

The communications devices 11c, 12c of the charge terminals 11, 12 receive the ID request signal and transmit an ID request signal to vehicles. In the present case, the vehicle 6a is connected with the charge terminal 11; thus, the ID request signal is transmitted to the communications device 9 of the vehicle 6a. In contrast, any vehicle is not connected with the charge terminal 12; thus, the above ID request signal transmitted from the charge terminal 12 does not reach anywhere.

Upon receiving the transmitted ID request signal, the communications device 9 of the vehicle 6a generates vehicle information. The vehicle information contains an own vehicle ID, a name of the vehicle, a number of the number plate of the vehicle 6a, all of which are stored in the ID storage device 10 of the vehicle 6a. Thus, the vehicle information containing the vehicle ID, the name of the vehicle, and the number of the license plate is returned to the charge terminal 11.

The communications device 11c of the charge terminal 11 transmits to the controller 5 a pair of (i) the received vehicle information and (ii) the own port number, to the controller 5. Herein, the port number is an identification number assigned to each of the charge terminals 11, 12, in order to distinguish the charge terminal 11 and the charge terminal 12, and previously stored in each of the communications devices 11c, 12c, respectively.

The signal of the pair of the vehicle information and the port number can be transmitted to the controller 5 before the timeout period elapses, if the communications process is executed as usual: The control circuit 55, which received the signal before the timeout period elapses, determines at S115 that the vehicle ID is acquired, thereby ending the transmission of the ID request signal and then executing subsequent S125.

At S125, the received vehicle information is displayed in the display device 52. For example, as illustrated in FIG. 4B, the vehicle name and the number of the license plate in the received vehicle information are displayed.

At S125, a display is made which urges a user to manipulate whether to register the displayed vehicle. For example, as illustrated in FIG. 4B, the display indicates pressing of A button when registering and pressing of B button when canceling the registration.

Then, at S130, the processing waits for a manipulation by a user to the manipulation device 51. When the manipulation is made, it is determined whether the manipulation indicates the registration. When the manipulation is determined to indicate the registration, the determination at S130 is affirmed; then, the processing proceeds to S135.

At S135, both (i) the button which is determined to have received the long-press manipulation at S105 and (ii) the vehicle ID acquired at S115 are stored in association with each other in the storage device 54. As exemplified in FIG. 4C, the display device 52 displays (i) a notification that the registration is made to the button undergoing the long-press manipulation (A button in FIG. 4C, and also referred to as a long-press manipulated button), and (ii) vehicle information corresponding to the vehicle registered with the button undergoing the long-press manipulation. Subsequently to S135, returning to S105, the processing waits for the button receives a long-press manipulation again.

A detailed method of association between the button and the vehicle is explained. The information on association between the button and the vehicle is recorded in a button-vehicle correspondence table. The button-vehicle correspondence table is exemplified in FIG. 5. As illustrated in FIG. 5, the button-vehicle correspondence table associates a vehicle ID for every button number. In other words, the button-vehicle correspondence table indicates one-to-one correspondence or association between vehicle IDs and button numbers. In FIG. 4, the button number A is assigned or associated with a vehicle ID12345-0000, while the button number B is not assigned or associated with any vehicle ID.

It is noted that the button number is a number for identifying a button (i.e., button switch) of the controller 5. In the example of FIG. 5, the button number A corresponds to A button, and the button number B corresponds to B button. Therefore, the button-vehicle correspondence table of FIG. 5 illustrates that A button is associated with the vehicle 6a.

Thus, a user connects only one vehicle 6a to the charge terminal, and then performs or applies a long-press manipulation (as explained above, corresponding to an example of a second manipulation or a second manipulation manner, and also referred to as a registration manipulation) to a button (corresponding to an example of a first manipulation means or section) with which the vehicle 6a is registered (see S105). Upon such manipulation of the user, the controller 5 acquires a vehicle ID of the vehicle 6a via the charge terminal 11 (see S115), and stores the acquired vehicle ID and the button number of the button to which the long-press manipulation was applied in the button-vehicle correspondence table in association with each other (see S135).

Thus, using an easy method of connecting the vehicle to the charge apparatus 1 and carrying out the long-press manipulation of the button, the user can associate the vehicle and the button with each other.

In the present case, when the vehicle information from the vehicle 6a does not reach the controller 5 until the timeout period elapses, the determination at S120 is affirmed, thereby stopping the transmission of the ID request signal and then advancing the processing to S140.

The reason why the vehicle information from the vehicle 6a does not reach the controller 5 is, for instance, as follows: the connection between the vehicle 6a and the charge terminal 11 is imperfect; or the communications function of any one of the controller 5, the charge apparatus 1, and the vehicle 6a is malfunctioned.

At S140, the display device 52 is caused to display a notification which indicates the vehicle was not detected, as illustrated FIG. 4D, while displaying an inquiry whether to try again to acquire.

Then, at S145, the processing waits for the user to manipulate. When a manipulation to request retrial of acquisition is made, the processing returns to S110, where the acquisition of the vehicle ID is re-started. Such a case is exemplified such that after going out of the building 4 and ensuring again the connection of the power cable, the user executes the manipulation to retry the acquisition. When a manipulation not to request the retrial of acquisition is made, the processing returns to S105, where the long-press manipulation to a button is awaited.

Next, the operation after completing the registration of the vehicle is explained. For instance, it is supposed that the vehicle 6a is associated with A button whereas the vehicle 6b is associated with B button. In this case, with respect to the button-vehicle correspondence table, as illustrated in FIG. 6, the button number of A button is associated with the vehicle ID of the vehicle 6a, whereas the button number of B button is associated with the vehicle ID of the vehicle 6b.

In such a case, as explained below, even if the vehicle 6a is connected with either the charge terminal 11 or the charge terminal 12, when A button associated with the vehicle 6a is pushed or pressed, the charge status of the vehicle 6a is displayed in the display device 52. The same is applied to the vehicle 6b.

The vehicle 6a is parked at a parking lot in which the charge apparatus 1 is arranged; then, the user of the vehicle 6a connects the battery 7 of the vehicle 6a to either the charge terminal 11 or the charge terminal 12 using a power cable. Further, similarly, the vehicle 6b is parked at the parking lot in which the charge apparatus 1 is arranged; then, the user of the vehicle 6b connects the battery 7 of the vehicle 6b to either the charge terminal 11 or the charge terminal 12 using a power cable. The following explains the case where the vehicle 6a is connected to the charge terminal 12, and the vehicle 6b is connected to the charge terminal 11.

Figure 7:
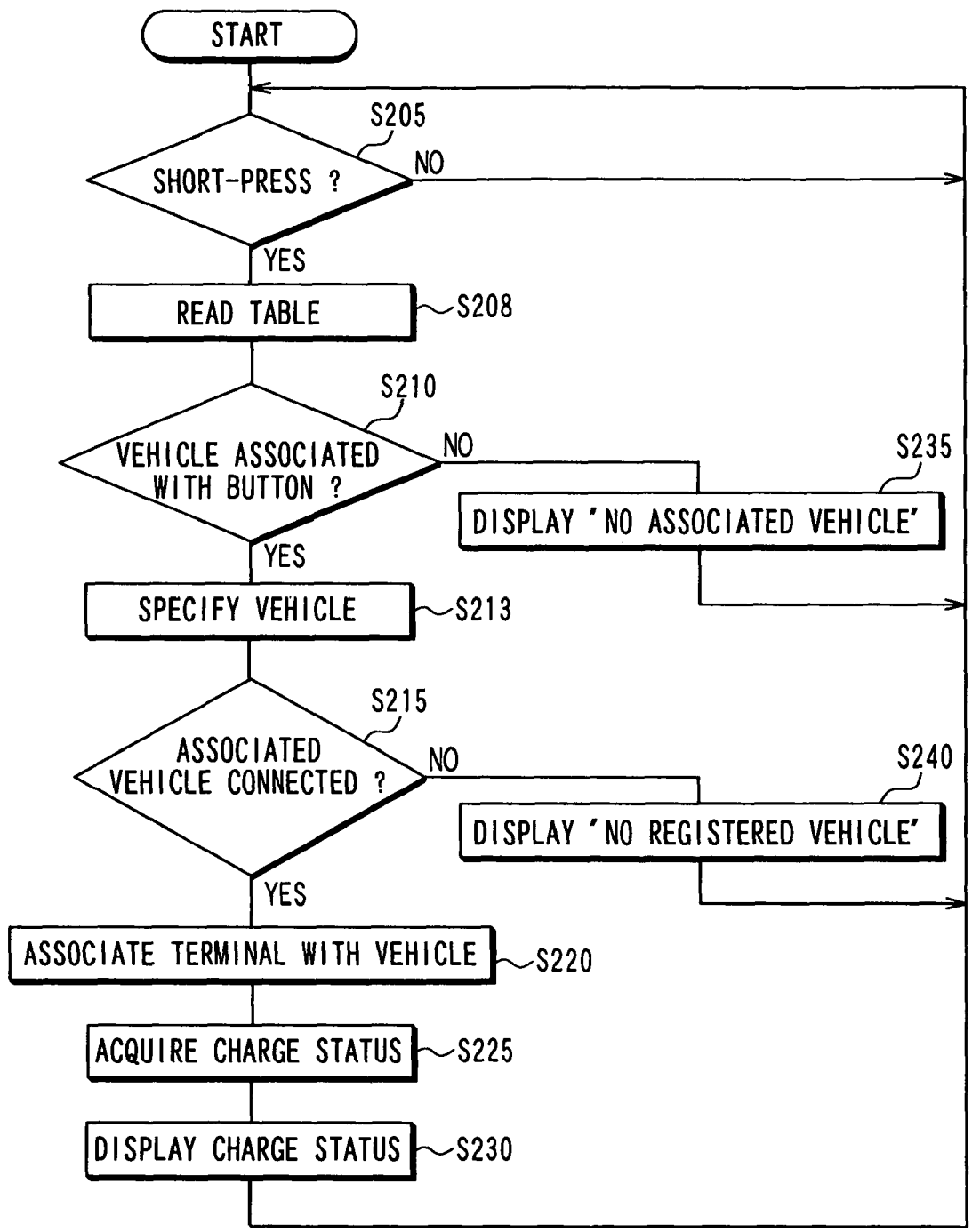
FIG. 7 is a flowchart illustrating a charge status display process.

When such connections are established, the charge terminals 11, 12 supply electric power to each battery 7 via the power cable. FIG. 7 illustrates a flowchart of a charge status display process which the control circuit 55 of the controller 5 executes for displaying the charge status of the vehicles. The control circuit 55 executes a predetermined program in the ROM, thereby realizing the charge status display process.

This charge status display process is executed in the state that the processing in the registration process of FIG. 3 waits for a long-press manipulation at S105. First, the user performs a short-press manipulation to A button or B button. The short-press manipulation signifies a short-time press manipulation to a button; the short time is defined as being a period shorter or less than a first reference period. In other words, the short-time press manipulation signifies continuing of pressing a button for a duration less than the first reference period. Naturally, the first reference period, which is used for determining the short-press manipulation, may be at least not longer than the second reference period, which is used for determining the long-press manipulation.

As explained above, A button or B button can receive, in a predetermined situation such as S105 in the registration process and S205 in the present process, several manipulations or several manipulation manners such as a short-press manipulation (referred to as a first manipulation or a first manipulation manner) and a long-press manipulation (referred to as a second manipulation or a second manipulation manner), which is explained above.

When the short-press manipulation to A button or B button is carried out, the control circuit 55 determines at S205 that the short-press manipulation is made to either A button or B button. Then, the processing proceeds to S208, where the button-vehicle correspondence table is read. The processing then proceeds to S210. Herein, it is determined whether a vehicle is associated with the button to which the short-press manipulation is applied according to the contents of the button-vehicle correspondence table. In this case, the vehicle is associated with each of A button and B button; thus, even if either receives the short-press manipulation, the determination result at 210 is affirmative. The processing subsequently proceeds to S213.

At S213, the vehicle ID associated with the button, which the above short-press manipulation is applied to, is specified in the button-vehicle correspondence table. If the button having received the short-press manipulation (also referred to as a short-press manipulated button) is A button, the vehicle ID of the vehicle 6a is specified.

At S215, it is determined whether a vehicle associated with the button having received the short-press manipulation is connected with either of the charge terminals 11, 12, or whether the foregoing vehicle is not connected to either of the charge terminals 11, 12.

This determination is made by transmitting the ID request signal to the charge terminals 11, 12 and confirming the presence or absence of the response to the transmission, as executed at S110 of the registration process of FIG. 3. In detail, the ID request signal is transmitted to the charge terminals 11, 12. When the vehicle information containing the vehicle ID of the vehicle is received along with the port number, the determination at S215 is affirmed. When the vehicle information containing the vehicle ID of the vehicle cannot be received, the determination at S215 is negated.

In the present case, when the ID request signal is transmitted to the charge terminals 11, 12, the vehicle information on the vehicle 6b is returned along with the port number of the charge terminal 11 while the vehicle information on the vehicle 6a is also returned along with the port number of the charge terminal 12. Therefore, even if the short-press manipulated button is either A button or B button, the determination at S215 is affirmed; then the processing proceeds to S220.

At S220, the vehicle and the charge terminal of the connection destination of the vehicle are associated with each other. In detail, (i) the vehicle ID contained in the vehicle information (namely, vehicle information on the vehicle associated with the button having received the short-press manipulation) received at S215, and (ii) the port number received along with the vehicle information are stored in the storage device 54 in association with each other.

Figures 8, 9:
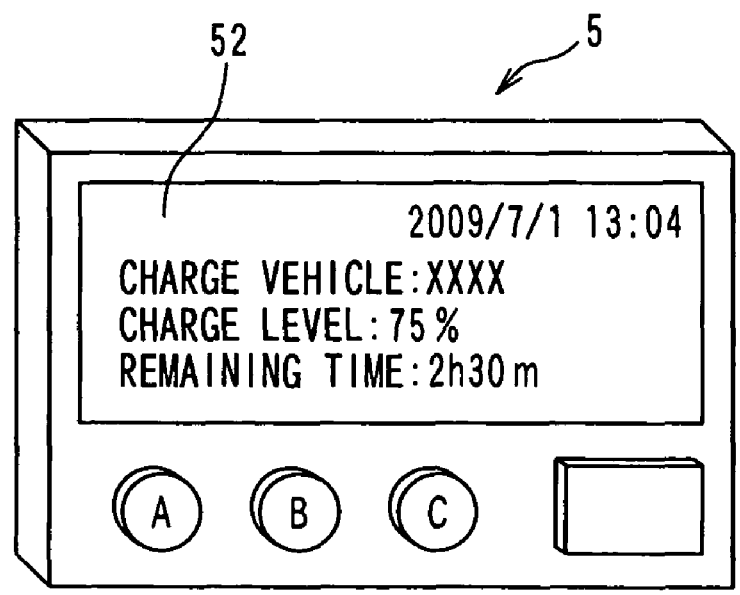
FIG. 8 is a diagram illustrating a correspondence table between a charge terminal and a vehicle in a storage device of the controller.
FIG. 9 is a diagram illustrating an example of a display of a charge status.

A detailed method of association between the charge terminal and the vehicle is explained. The information on association between the charge terminal (i.e., port number) and the vehicle is recorded in a terminal-vehicle correspondence table. The terminal-vehicle correspondence table is exemplified in FIG. 8. As illustrated in FIG. 8, the terminal-vehicle correspondence table associates a vehicle ID with every port number. The terminal-vehicle correspondence table in FIG. 8 illustrates the case where the short-press manipulation to B button is made and the vehicle ID of the vehicle 6b is associated with the port number 1 of the charge terminal 11 at S220. When the short-press manipulation to A button is made and the vehicle ID of the vehicle 6b is associated with the port number 2 of the charge terminal 12 at S220.

Then, at S225, the charge status of the vehicle associated with the button, which the short-press manipulation is made to, is acquired. In detail, the vehicle corresponding to the button to which the short-press manipulation is made is specified by referring to the button-vehicle correspondence table; in addition, the charge terminal associated with the vehicle is specified by referring to the terminal-vehicle correspondence table. The thus-specified charge terminal is the charge terminal connected with the vehicle associated with the button to which the short-press manipulation is made.

The control circuit 55 transmits a charge status request signal which requests a charge status to the charge terminal thus-specified, and waits for a response from the charge terminal 11 of the transmission destination.

The communications device of the charge terminal, which receives this charge status request signal, transfers this charge status request signal to the vehicle which is connected with. The communications device 9 of the vehicle which received the charge status request signal prepares charge status information upon receiving the transferred charge status request signal. The charge status information includes a present charge status of the battery 7 detected by the detection device 8, as well as the own vehicle ID, a name of the vehicle, a number of the number plate of the vehicle, all of which are stored in the ID storage device 10. The charge status information is then returned to the charge terminal. The communications device of the charge terminal transfers the received charge status information to the controller 5.

Thus, the control circuit 55 receives the charge status information transferred to the controller 5, then advancing the processing to S230, where the charge status is displayed. For example, as illustrated in FIG. 9, a display (i.e., a display window) contains the vehicle name in the received charge status information, a charge level, and a remaining charge time up to a time when a full charge is completed. The remaining charge time may be received from the vehicle as a part of the charge status information. Otherwise, it may be obtained by multiplying a value, which is obtained by subtracting the charge level from 100%, by a necessary charge time per one %. The necessary charge time per one % may be a predetermined fixed value. Subsequently to S230, the processing returns to S205, where the processing waits until a short-press manipulation is made to either A button or B button.

Under the above configuration, when the user executes a short-press manipulation (referred to as a first manipulation, and also referred to as an associated vehicle detection manipulation, an association confirmation manipulation, or a display manipulation) against A button or B button (see S205), a vehicle ID is specified which is associated with a button having received a short-press manipulation, i.e., short-press manipulated button (equivalent to an example of a first manipulation means or section) based on the button-vehicle correspondence table (see S213). A charge terminal is specified which a vehicle corresponding to the vehicle ID is connected with (see S220). Charge status information of the vehicle is acquired via the specified charge terminal, and displayed in the display device 52 (see S230).

In the present case, when the short-press manipulation is made to A button, the vehicle 6a associated with A button is specified based on the button-vehicle correspondence table. The charge terminal 12 connected to the specified vehicle 6a is specified. The charge status request signal is transmitted to the vehicle 6a via the specified charge terminal 12. Thereby, the charge status information is acquired from the vehicle 6a and displayed.

The same takes place even when the vehicle 6a is connected to the charge terminal 11 instead of the charge terminal 12. In such a case, when the short-press manipulation is made to A button, the vehicle 6a associated with A button is specified based on the button-vehicle correspondence table. The charge terminal 11 connected to the specified vehicle 6a is specified. The charge status request signal is transmitted to the vehicle 6a via the specified charge terminal 11. Thereby, the charge status information can be acquired from the vehicle 6a and displayed. That is, even if the vehicle 6a is connected to any of the charge terminals, short-time pressing of A button results in displaying the charge status of the vehicle 6a certainly. Thus, if at least the user remembers that the vehicle 6a is associated with A button, the user can certainly confirm the charge status of the vehicle 6a without needing to be conscious of which charge terminal the vehicle 6a is connected with. That is, such a configuration can decrease a possibility that a user mistakenly executes a short-press manipulation against a wrong button to thereby display a charge status of a battery of an unintended vehicle.

It is noted that when a short-press manipulation is made to either A button or B button, of which the association with any vehicle is not recorded or stored, it is determined that any vehicle is not associated with the button to which the short-press manipulation was made at S210 subsequent to S205. The processing proceeds to S235, where a warning message indicating that any vehicle is not associated with the button to which the short-press manipulation was carried out is displayed in the display device 52. Then, the processing returns to S205.

In addition, another scene may take place where even though the vehicle 6a is associated with button A in the button-vehicle correspondence table, the vehicle 6a is connected to no charge terminal in the stage where the short-press manipulation to A button is carried out. In such a scene, posterior to the affirmative determinations at S205, S210, the vehicle information containing the vehicle ID of the vehicle 6a is unreceivable at S215; thus, it is determined that the vehicle 6a is not connected with any of the charge terminals 11, 12, and the processing proceeds to subsequent S240. At S240, a warning message is displayed in the display device 52; the warning message indicates that the registered vehicle 6a, i.e., the vehicle associated with A button having received the short-press manipulation is not connected with any charge terminal.

Second Embodiment

Figure 10:
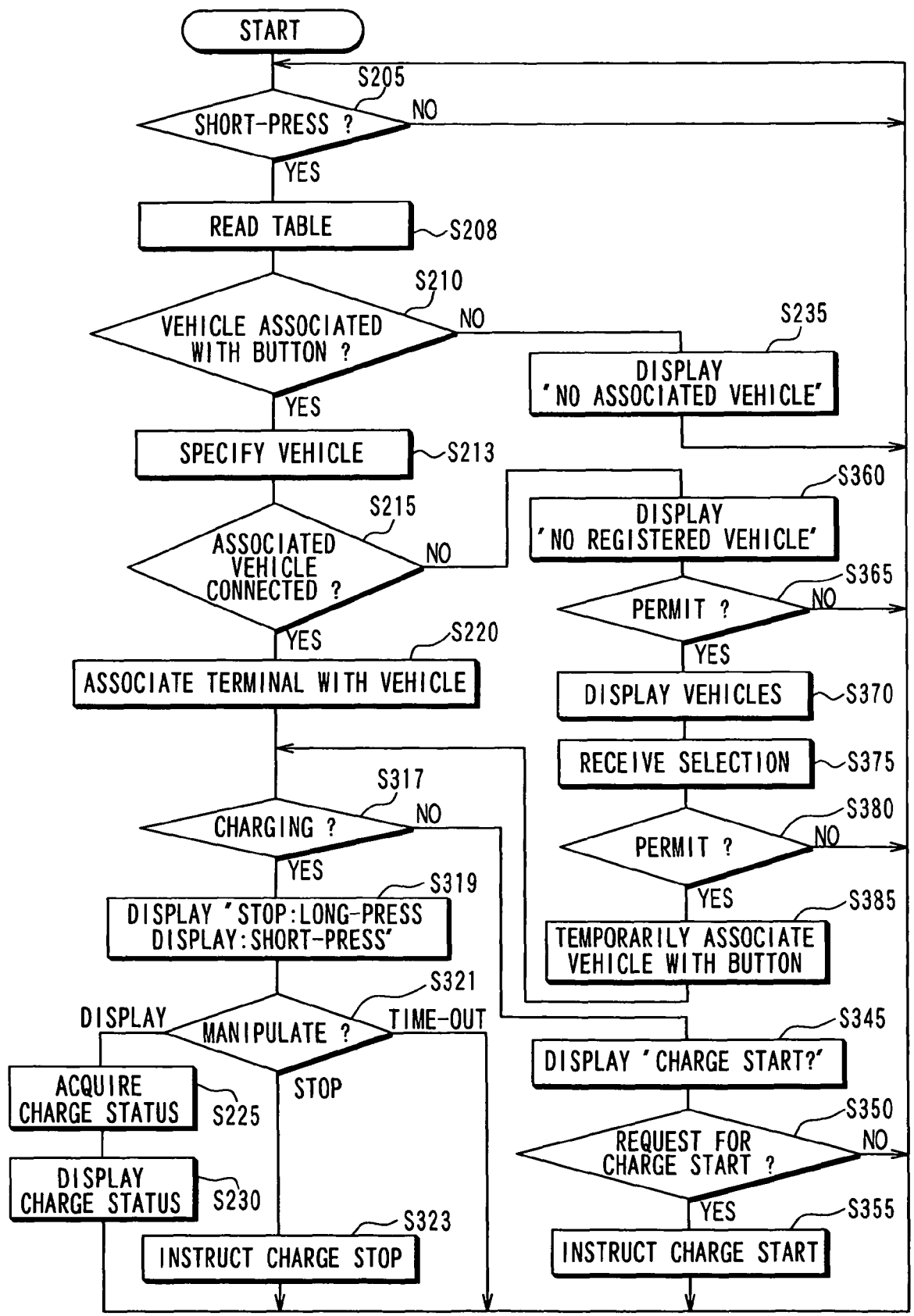
FIG. 10 is a flowchart illustrating a power supply control and charge status display process.

The following explains a second embodiment. The present second embodiment differs from the first embodiment in that the control circuit 55 of the controller 5 (serving as an example of a charge status display apparatus and an example of an electric power supply control apparatus) of the present embodiment executes a power supply control and charge status display process in FIG. 10 instead of the charge status display process illustrated in FIG. 7. It is noted that the sections or steps designated by the same reference numerals in FIGS. 7 and 10 are identical to each other, therefore eliminating a detailed explanation.

Figure 13:
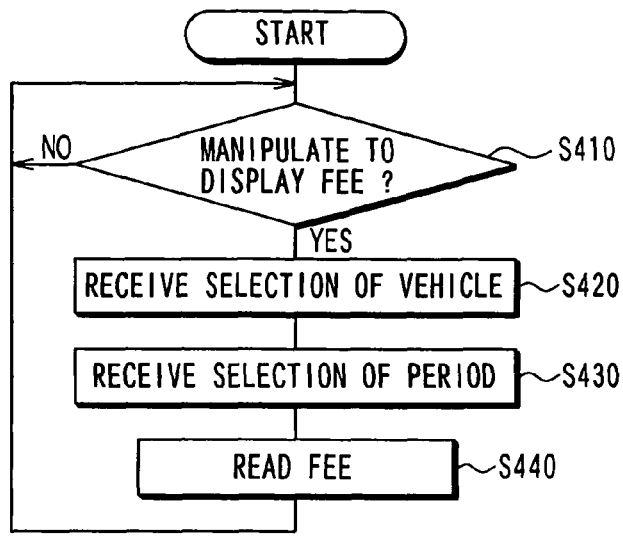
FIG. 13 is a flowchart illustrating an electricity fee display process.

Hereinafter, the operation of the electric power supply system at the time of the control circuit 55 executing this electric power supply control and charge status display processing is explained. The control circuit 55 executes a predetermined program in the ROM, thereby realizing the electric power supply control and charge status display process. In addition, this electric power supply control and charge status display process is executed under a state where the processing waits for a long-press manipulation at S105 in the registration process of FIG. 3 and, at the same time, waits for an electricity fee display manipulation at S410 in an electricity free display process of FIG. 13 mentioned later.

Now, the vehicle 6a' is parked at a parking lot in which the charge apparatus 1 is arranged; then, the user of the vehicle 6a connects the battery 7 of the vehicle 6a to either the charge terminal 11 or the charge terminal 12 using the power cable. Further, similarly, the vehicle 6b is parked at the parking lot in which the charge apparatus 1 is arranged; then, the user of the vehicle 6b connects the battery 7 of the vehicle 6b to either the charge terminal 11 or the charge terminal 12 using the power cable. The following explains the case where the vehicle 6a is connected to the charge terminal 12, and the vehicle 6b is connected to the charge terminal 11.

For instance, it is supposed that the vehicle 6a is associated with A button whereas the vehicle 6b is associated with B button (see FIG. 6). In such a case, as explained in the following, even if the vehicle 6a is connected to whichever of the charge terminals 11, 12, as long as A button associated with the vehicle 6a is pressed, the display of the charge status and the execution or stop of the power supply can be made with respect to the vehicle 6a. The same is applied to the vehicle 6b.

The vehicle 6a is parked at a parking lot in which the charge apparatus 1 is arranged; then, the user of the vehicle 6a connects the battery 7 of the vehicle 6a to either the charge terminal 11 or the charge terminal 12 using the power cable. Further, similarly, the vehicle 6b is parked at the parking lot in which the charge apparatus 1 is arranged; then, the user of the vehicle 6b connects the battery 7 of the vehicle 6b to either the charge terminal 11 or the charge terminal 12 using the power cable. The following explains the case where the vehicle 6a is connected to the charge terminal 12, and the vehicle 6b is connected to the charge terminal 11.

In the stage at which such connection is completed, the electric power supply to the vehicles 6a, 6b from the charge terminals 11, 12 is not started yet. That is because the control circuit 55 controls the switch device 2 so that the switch device 2 does not supply the electric power to the electric power supply device 11b of the charge terminal 11, and the electric power supply device 12b of the charge terminal 12 until the electric power supply is started at S355 mentioned later. It is noted that the control circuit 55 stores in the storage device 54 the information on whether the switch device 2 is presently supplying the electric power to the electric power supply device 11b and whether the switch device 2 is presently supplying the electric power to the electric power supply device 12b. In detail, when no electric power supply is made, the storage device 54 is made to store the information indicating that the electric power is not supplied to the electric power supply device 11b and the electric power supply device 12b.

Under such a state, the user enters the building 4 and executes the short-press manipulation against A button or B button of the controller 5. When the short-press manipulation (serving as an example of a first manipulation, and also referred to as an associated vehicle detection manipulation, an association confirmation manipulation, a display manipulation, or an electric power charge control manipu) to A button or B button is carried out, the control circuit 55 determines at S205 that the short-press manipulation is made either A button or B button. Then, the processing proceeds to S208, where the button-vehicle correspondence table is read. Then, at S210, it is determined that the vehicle is associated with the button to which the short-press manipulation was carried out. Then, at S213, a vehicle ID is specified which is associated with the button (serving as an example of a first manipulation means or section) having received the short-press manipulation. At S215, it is determined that a vehicle corresponding to the vehicle ID associated with the button having received the short-press manipulation is connected with either of the charge terminals 11, 12. Furthermore, the short-press manipulation is applied to A button, in the present embodiment. Subsequently, at S220, the vehicle 6a associated with A button having received the short-press manipulation and the charge terminal 12 which the vehicle 6a is connected with are associated in the terminal-vehicle correspondence table.

Then, at subsequent S317, it is determined whether the electric power supply is being presently being made to the vehicle 6a associated with A button having received the short-press manipulation. In detail, it is determined whether the switch device 2 is supplying the electric power to the electric power supply device 12b of the charge terminal 12 to which the vehicle 6a is connected. That the vehicle 6a is connected with the charge terminal 12 is determined based on the terminal-vehicle correspondence table recorded at S220.

When it is determined that the electric power is being supplied, the processing proceeds to S319; in contrast, when it is determined that the electric power is not being supplied, the processing proceeds to S345. In the present case, since the electric power is not supplied yet by the charge terminal 12 to which the vehicle 6a is connected, the processing proceeds to S345.

At S345, the display device 52 is controlled so as to display an inquiry as to whether to start the charge or not while illustrating an indication or notification teaching a button (for example, A button) which should be pushed in order to start the charge and a button (for example, button B) which should be pushed in order not to start the charge.

Then, at S350, it is determined whether the charge start request occurs or is manipulated. In detail, when while the processing waits for the user to press the button, a press manipulation is made to the button which should be pushed in order to direct the start of the charge, it is determined that the charge start request occurred. The processing then proceeds to S355. When while the processing waits for the user to press the button, a press manipulation is made to the button which should be pushed in order to direct the not-start of the charge, it is determined that the charge start request does not occur. The processing then returns to S205.

The switch device 2 is controlled at S355 so that the electric power supply is executed to the charge terminal 12 associated with the vehicle 6a (namely, vehicle associated with A button to which the short-press manipulation is made at S205) in the terminal-vehicle correspondence table. Furthermore, the information indicating that the electric power supply is being executed to the charge terminal 12 is recorded in the storage device 54. After S355, the processing returns to S205.

Thus, when the user connects the vehicle 6a to the charge terminal 12 and carries out the short-press manipulation to A button (see S205), the vehicle 6a is specified which is associated with the short-press manipulated button based on the button-vehicle correspondence table (see S213). The charge terminal 12 is then specified which is connected with the vehicle 6a (see S220). If the electric power supply is not carried out to the electric power supply device 12b of the charge terminal 12 (see S317), the start of the electric power supply to the electric power supply device 12b is determined according to the user's manipulation relative to the start of the electric power supply (see S350). Thereby, the charge terminal 12 is controlled such that the electric power supply to the vehicle 6a is started (see S355).

In the present case, when, after the charge of the vehicle 6a starts, the user executes a short-press manipulation to the same A button again, the control circuit 55 executes the processing at S205, S210, S215, S220, and S317 as the above-mentioned procedure. However, at S317, since the storage device 54 stores the information indicating that the electric power supply is being executed to the charge terminal 12 to which the vehicle 6a is connected, the determination at S317 is affirmed. The processing proceeds to S319.

At S319, the display device 52 is caused to display an inquiry as to whether to stop the charge or confirm the charge status. In detail, a display (i.e., a display window) appears which indicates a method (for example, long-press manipulation to A button) for the charge stop manipulation to request the stop of the charge, and a method (for example, short-press manipulation to A button) for the charge status display manipulation to request the display of the charge status.

Then, at S321, the processing waits until a timeout period elapses since the display started at S319. When the timeout period elapses, the processing returns to S205. In contrast, when the charge status display manipulation is executed before the timeout period elapses, the processing proceeds to S225. When the charge stop manipulation is executed before the timeout period elapses, the processing proceeds to S323.

After the charge status display manipulation is executed, at S225, the charge status of the vehicle 6a associated with A button to which the short-press manipulation was carried out at previous S205 is acquired. Then, at S230, the acquired charge status is displayed. The processing then returns to S205.

After the charge stop manipulation is executed, at S323, the switch device 2 is controlled so that the electric power supply is stopped to the charge terminal 12 associated with the vehicle 6a (namely, vehicle associated with A button to which the short-press manipulation is made at just previous S205) in the terminal-vehicle correspondence table. Furthermore, the information indicating that the electric power supply is not being executed to the charge terminal 12 is recorded in the storage device 54. After S323, the processing returns to S205.

Thus, when the user executes the short-press manipulation to A button which is associated with the vehicle 6a which is being charged (see S205), the vehicle 6a associated with the short-press manipulated button is specified based on the button-vehicle correspondence table (see S215). The charge terminal 12 is specified which is connected with the vehicle 6a (see S220). It is determined that the electric power supply is being carried out to the electric power supply device 12b of the charge terminal 12 (see S317). According to the charge status display manipulation by the user (see S321), the charge status of the battery 7 of the vehicle 6a is displayed (see S323). According to the charge stop manipulation by the user (see S321), the charge is stopped (see S323).

Thus, in the present case, when the short-press manipulation of the A button is carried out, the vehicle 6a associated with A button in the button-vehicle correspondence table is specified. The charge terminal 12 connected to the specified vehicle 6a is specified. The charge status request signal is transmitted to the vehicle 6a via the specified charge terminal 12. Thereby, the charge status information is acquired from the vehicle 6a and displayed. Therefore, similarly to the first embodiment, even if the vehicle 6a is connected to any of the charge terminals, short-time pressing of A button results in displaying the charge status of the vehicle 6a certainly. That is, such a configuration can decrease a possibility that a user mistakenly executes a manipulation to a wrong manipulation device to thereby display a charge status of a battery of an unintended vehicle.

In the present case, the charge terminal 12 connected to the vehicle 6a is specified. The switch device 2 is controlled to switch the execution or non-execution of the electric power supply to the electric power supply device 12b of the charge terminal 12. Therefore, even if the vehicle 6a is connected to any of the charge terminals, pressing A button certainly allows the control of the execution or non-execution of the charge of the vehicle 6a.

Under such a configuration, regardless of which charge terminal an intended vehicle is connected with, if at least the user remembers that the vehicle 6a is associated with A button, the user can certainly confirm the charge status of the battery of the vehicle 6a without needing to be conscious of which charge terminal the vehicle 6a is connected with. The start and stop of the charge of the battery of the vehicle 6a are certainly controllable. That is, such a configuration can decrease a possibility that a user mistakenly executes a manipulation against a wrong button to thereby control the power supply and display a charge status of a battery, with respect to an unintended vehicle.

It is noted that even if the short-press manipulation of A button or B button is carried out, there may be a case where association between the button having received the short-press manipulation and a vehicle is not recorded in the button-vehicle correspondence table. In such a case, the processing proceeds to S235 from S210, where a warning message indicating that any vehicle is not associated with the button to which the short-press manipulation was carried out is displayed in the display device 52. Then, the processing returns to S205.

The following explains the case where the charge terminal 11 is connected with a vehicle which is not associated with any button in the button-vehicle correspondence table. The vehicle which is not associated with the button in the button-vehicle correspondence table can be estimated to be a vehicle which is not frequently parked at the charge apparatus 1.

Such a case may occur as follows. A person unrelated to the user of the vehicle registered in the button-vehicle correspondence table may intend to charge a certain vehicle using the charge apparatus 1 without the permission of the authenticated or registered user. It is hard to assume that the person goes into the building 4 and manipulates the controller 5 directly. Instead, the foregoing person may connect the certain vehicle with the charge apparatus 1 beforehand and wait for the usual user of the charge apparatus 1 to manipulate the controller 5 carelessly within the building 4, thereby mistakenly starting the charge.

In addition, there may be another case where a friend of the user of the registered vehicle, etc. may get the user's permission, and charge a certain vehicle using the charge apparatus 1.

Hereinafter, in the present case, it is premised that the vehicle 6a associated with A button is not connected with the charge apparatus 1.

In such a case, when the short-press manipulation to A button is carried out by a user, the control circuit 55 determines at S205 that the short-press manipulation is made to A button. Then, at S210, it is determined that the vehicle 6a is associated with the button to which the short-press manipulation was carried out. The processing then proceeds to S215. However, at S215, since the vehicle 6a is not actually connected to the charge apparatus 1, the vehicle information containing the vehicle ID of the vehicle 6a cannot be received via the charge apparatus 1. Thus, it is determined that the vehicle 6a is not connected with any of the charge terminals 11, 12, and the processing proceeds to subsequent S360. At S360, a warning message is displayed in the display device 52; the warning message indicates that the registered vehicle 6a, i.e., the vehicle associated with A button having received the short-press manipulation is not connected with any charge terminal.

A display example at S360 is illustrated in FIG. 11A. This display also contains a display item to urge the user to select whether to permit the charge specially. In detail, the display contains a method (for example, A button press) for a permission manipulation for selecting a vehicle to which the charge is permitted specially, and a method (for example, B button press) for a stop manipulation for not permitting the charge.

Then, at S365, the processing waits for the user to execute any manipulation. When the permission manipulation is made, the processing proceeds to S370. When the stop manipulation is made, the processing returns to S205.

Under such a configuration, even if the user executes the short-press manipulation of A button or B button (see S205), if the vehicle associated with the button is not connected to either the charge terminal 11 or the charge terminal 12 (see S215), as long as there is no user's permission manipulation (see S365), the charge to the vehicle connected to the charge apparatus 1 is not started. Thus, there may be a case that someone intends to charge a certain vehicle using the charge apparatus 1 without permission, connects the certain vehicle to the charge apparatus 1, and waits for the authenticated user of the charge apparatus 1 to carelessly execute the manipulation for starting the charge. Even in such a case, the vehicle ID of the certain vehicle is not associated with the button in the correspondence table, and the authenticated user must not execute any special permission manipulation for such a certain vehicle. The charge is thereby not executed to the certain vehicle.

In contrast, after the permission manipulation, at S370, the vehicle information (for example, a name of the vehicle, a number of the license plate) is displayed with respect to all the vehicles connected to the charge terminals 11, 12. The vehicle information on the vehicle connected to each of the charge terminals 11, 12 transmits an ID request signal to each vehicle via each charge terminal 11, 12. Thereby, it is realizable by receiving the response from each vehicle via each charge terminal 11, 12.

At S370, a display is made to urge the user to select one of the vehicles displayed in the display device 52. For example, the message is displayed which urges the user to select a vehicle as illustrated in FIG. 11B along with a method (A button press, B button press) for a selection manipulation for every vehicle. The correspondence between A button/B button displayed as the methods of selection manipulations and the vehicles is unrelated to the contents of the registration (namely, the contents of the button-vehicle correspondence table). For example, A button is used for selecting the vehicle connected to the charge terminal 11, whereas B button is used for selecting the vehicle connected to the charge terminal 12.

Then, at S375, the selection of the vehicle is received. For example, the user executes the press of the button corresponding to the friend's vehicle, thereby making it possible to select the friend's vehicle. After the user executes the manipulation to select the vehicle, a display is made at S380 to inquire whether to actually select or not, as illustrated in FIG. 11C. The processing waits for the user to execute an affirmative manipulation or a negative manipulation. When the affirmative manipulation is made, the processing then proceeds to S385. When the negative, manipulation is made, the processing returns to S205.

At S385, the selected vehicle is associated with A button to which the short-press manipulation was carried out at previous S205. That is, temporary data in which the button number of A button is associated with the vehicle ID (it is acquired at S370) of the selected vehicle is additionally stored in the button-vehicle correspondence table in the storage device 54. As illustrated in FIG. 11D, the completion of the association is displayed in the display device 52.

It is noted that the temporary data is attached with a flag indicating the temporary data; thus, the temporary data and the data which is not the temporary data are distinguishable in the button-vehicle correspondence table. While the vehicle is associated with a button in the temporary data, the control circuit 55 may be designed to disregard any data other than the temporary data which associates the button and vehicle with each other (that is, to regard any data other than the temporary data as being not existing).

In addition, the control circuit 55 may erase this temporary data when a predetermined period (for example, one day) elapses since the temporary data is generated. Otherwise, when the vehicle concerning the temporary data is separated from the charge apparatus 1, the temporary data may be erased. Further, when the electric power supply to the battery of the vehicle is completed, the temporary data may be erased. Otherwise, when a special manipulation to the manipulation device 51 (for example, manipulation of pressing A button and B button at the same time or simultaneously) is executed, the temporary data may be erased.

Under such a configuration, even if there is a vehicle which is not previously assigned to the button in the button-vehicle correspondence table, if the user's permission manipulation and selection manipulation occur (see S365, S375, and S380), the button and the vehicle are temporarily associated in the button-vehicle correspondence table. The power supply control (start and stop of the charge) and the charge status display can be executed like in the usual registered vehicle.

The following explains a record of a charge history by the controller 5. The control circuit 55 records the charge historical data associated with the vehicle, as illustrated in FIG. 12 for every button. The charge historical data corresponding to one button is charge historical data about the vehicle associated with the one button.

As illustrated in FIG. 12, the charge historical data about a certain vehicle records, with respect to each one-time charge, a charge date (or time and date) when the charge is executed, an electrical power amount [kWh] supplied to the certain vehicle, and an electricity use fee [YEN] required for the charge.

In order to prepare such charge historical data, the control circuit 55 specifies, with respect to the charge to the certain vehicle, a charge period from the start time (corresponding to S355 of FIG. 10) to the stop time (corresponding to S323), calculates a supplied electric power amount and an electricity use fee according to the charge period, and records additionally the foregoing data along with the charge date in the charge historical data relative to the button associated with the certain vehicle.

The calculation of the power supply amount from the charge period may be made, for example, by multiplying the charge period by a predetermined power consumption [kW]. The calculation of the power supply amount from the charge period may be made by multiplying the consumed electricity amount computed from the charge period by a predetermined fee rate [YEN/kWh].

When such charge historical data is recorded for every button, the user may execute a fee indication manipulation to the display device 52 of the controller 5 (for example, C button press). The control circuit 55 may thereby display the electricity use fee based on the charge historical data corresponding to the button thereafter manipulated. For such a procedure, the control circuit 55 always executes a process illustrated in FIG. 13. The control circuit 55 executes a predetermined program in the ROM, thereby realizing the electricity use fee display process.

Figure 14A:
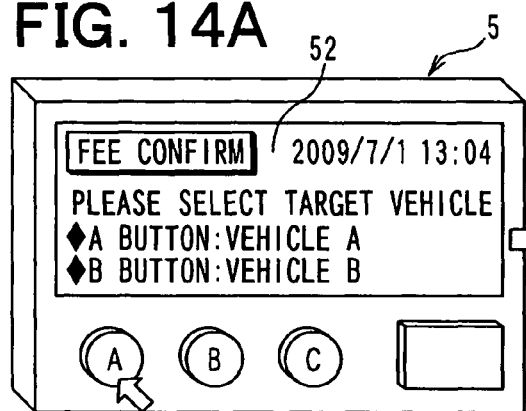
FIGS. 14A to 14C are diagrams illustrating examples of displays of an electricity fee display process.

In the electricity use fee display process, the processing waits for an electricity use fee display manipulation at S410. When the electricity use fee display manipulation is made, the processing receives a selection of a target vehicle for the electricity use fee display at S420. In detail, a message urging the user to select the target vehicle is displayed in the display device 52 as illustrated in FIG. 14A. Furthermore, based on the button-vehicle correspondence table, the information on the correspondence between the button and the vehicle is displayed. The processing then waits for the user to execute a press of either. A button or B button associated with the vehicle in the button-vehicle correspondence table.

Figure 14B:
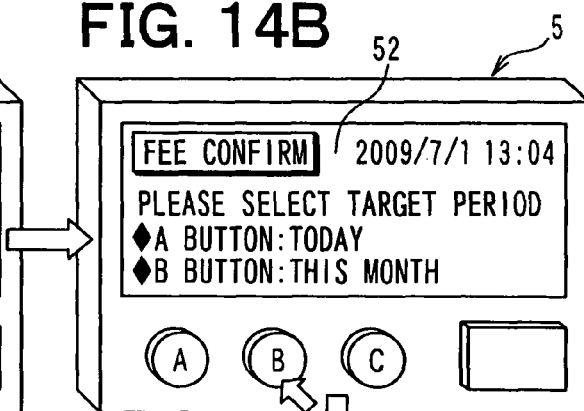

When the press is made, the processing proceeds to S430, where the processing receives a selection of a target period of the electricity use fee. For example, as illustrated in FIG. 14B, the display device 52 displays a message urging the user to select either of two different periods (in detail, today and this month) as a target period. Each of the two target periods (i.e., each of the selections) is displayed in correspondence with the button. The processing waits for the user to press one of the corresponding buttons.

Figure 14C:
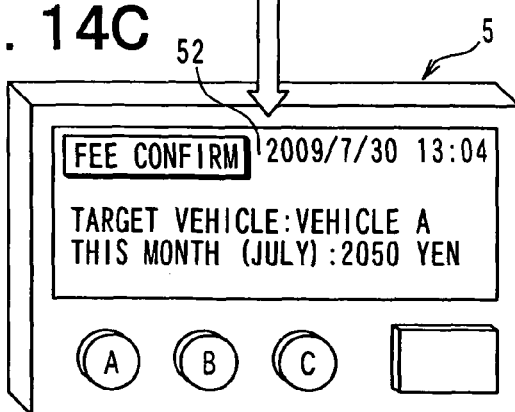

When one of the buttons is pressed, S440 is then performed to read the data of the electricity use fee in the target period selected at S430 from the charge historical data of the button associated with the vehicle selected at S420. Further, as illustrated in FIG. 14C, the result (i.e., the total) of having added these electricity use fees together is displayed in the display device 52 along with the name of the vehicle. After S440, the processing returns to S410.

Under such a configuration, the user executes an electricity use fee display manipulation and then presses the button associated with the target vehicle, making it possible to see the accumulated electricity use fee of the target vehicle.

It is noted that, in the first and second embodiments, the control circuit 55 of the controller 5 serves as an example of the following: a reading means or section by executing S208; a vehicle specification means or section by executing S213; a terminal specification means or section by executing S220; an acquisition means or section by executing S225; a display control means or section by executing S230; an ID acquisition means or section by executing S110, S115, and S120; an association means or section by executing S135; and an electric power supply means or section by executing S355.

Other Embodiments

While there have been described specific preferred embodiments of the present invention, it is to be distinctly understood that the present invention is not limited thereto and includes various modes capable of embodying functions of specifics of the present invention.

For instance, in the above embodiments, the control circuit 55 of the controller 5 displays the information on charge status received from the vehicle in a format illustrated in FIG. 9. However, the display format of the charge status may be modified as illustrated in FIGS. 15 to 17, 18A, 18B, and 19.

Figure 15:
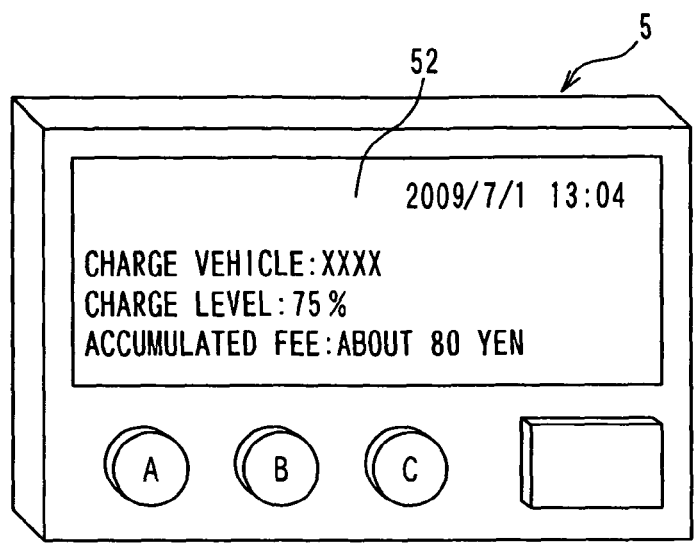
FIG. 15 is a diagram illustrating an example of another display of a charge status.

In the example of FIG. 15, the displayed charge information is a total of the electricity fee or bill relative to the present-time charge in addition to the charge level. The total of this electricity bill is computed based on the period from the charge start time of the present time to the present clock time. For example, a result of multiplication of the relevant charge period by a predetermined fee rate [YEN/time] may be used.

Figure 16:
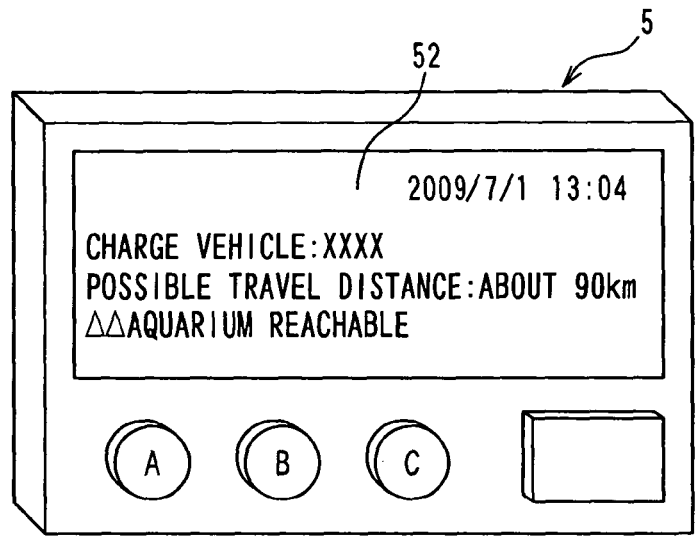
FIG. 16 is a diagram illustrating an example of another display of a charge status.

The example in FIG. 16 displays a possible travel distance, which a vehicle, which is associated with a button to which the short-press manipulation is made, can travel based on the present charge level without additional charge from now on, and a facility which can be reached by the possible travel distance from the vehicle present position (i.e., the position of the building 4). The possible travel distance is computed based on the present charge level. For example, a result of multiplication of the charge level by a predetermined distance conversion rate [km %] may be used.

In addition, the facility which can be reached is determined as follows. The storage device 54 of the controller 5 stores map data including information on positions of roads, positions and names of facilities, and the position of the building 4. Based on the map data, a range is determined which can be reached by only the possible travel distance along the road from the position of the building 4. One facility near a border of the range is extracted, and the name of the extracted facility is displayed in the display device 52.

Figure 17:
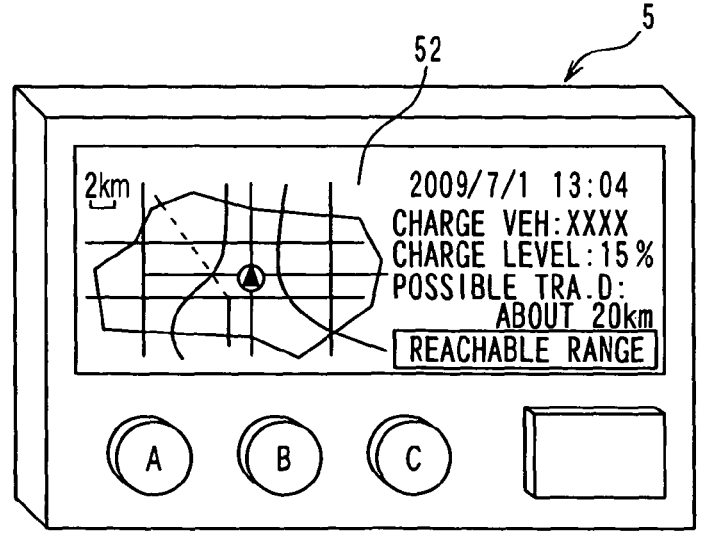
FIG. 17 is a diagram illustrating an example of another display of a charge status.

The example of FIG. 17 displays a geographical range which can be reached based on the above possible travel distance from the vehicle present position. The geographical range is also specified using the above-mentioned map data.

Figure 18A:
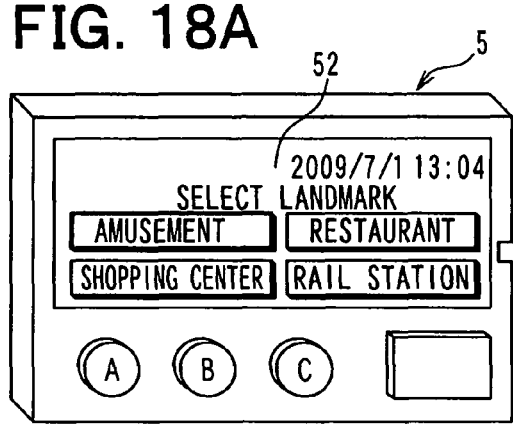
FIGS. 18A, 18B are diagrams illustrating examples of other displays of a charge status.
Figure 18B:
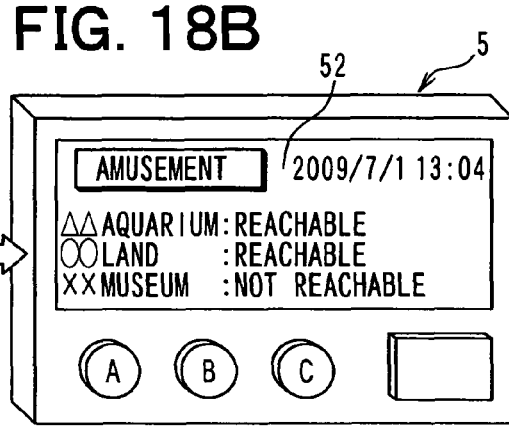

In the examples of FIGS. 18A, 18B, a user may selectively display several landmarks (see FIG. 18A). Further, when the user selects one or more out of the several displayed landmarks using a touch panel, the display appears which indicates whether facilities extracted based on the above landmark selection can be reached based on the present possible travel distance (see FIG. 18B). Similarly in this case, the map data is used to determine whether the facilities can be reached.

Figure 19:
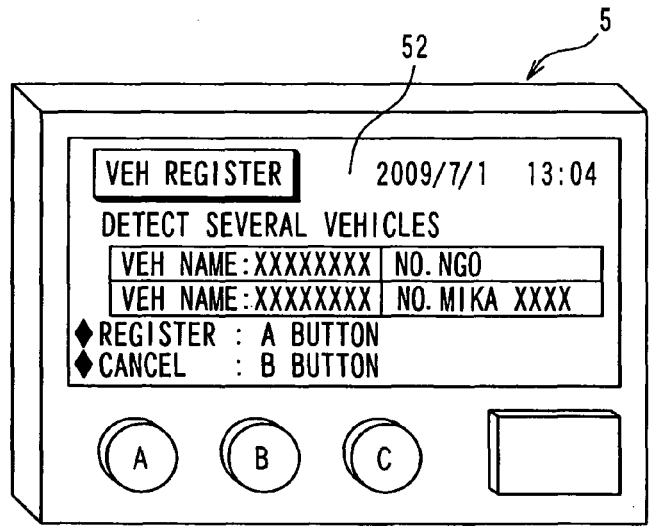
FIG. 19 is a diagram illustrating an example of another display in a registration process.

In addition, when vehicle IDs of two or more vehicles are acquired at S115 of the registration process in FIG. 3, the display at subsequent S125 may be made to display several vehicle information items as illustrated in FIG. 19, instead of that in FIG. 4B. When the registration manipulation is made at S130, each vehicle is associated with the different button and recorded in the button-vehicle correspondence table. In such a case, for example, the vehicle connected to the charge terminal 11 may be associated with A button, whereas the vehicle connected to the charge terminal 12 may be associated with B button.

In addition, in the above embodiments, the button or button switch is used as an example of a manipulation means or section. Such a button may be a mechanical button or a button displayed on a touch panel. In addition, the manipulation means or section may be not only a button but also an ON-OFF switch. That is, as long as the manipulation means or section is a section or device which can receive a certain manipulation, any kind of a manipulation means or section may be used. In addition, there may be three or more charge terminals which the charge apparatus 1 is provided with.

In addition, in the first embodiment, the control circuit 55 may be allowed not to control the switch device 2. In addition, the switch device 2 may not have the function which changes the execution and stop of the electric power supply to the charge terminal 11 and the charge terminal 12, but constantly supply an electric power.

In addition, in the above embodiments, the PLC is used for the communications between the charge terminals 11, 12 and the vehicle. Without need to be limited to the PLC, any communications method to use communications link other than the power cable may be adopted. However, it is necessary to connect the vehicle and the charge terminals 11, 12 using a communications link in addition to the power cable.

In addition, the charge terminal 11, 12 can communicate with both the vehicle 6a, 6b and the controller 5. However, there may be a case that the charge terminal 11, 12 is allowed to communicate with only either the vehicle 6a, 6b or the controller 5. For example, there may be a case that the vehicle 6a, 6b is able to communicate with the controller 5 directly (that is, not via the charge terminal 11, 12) via a wireless communications link (for example, wireless LAN, Zigbee (registered trademark)). In such a case, the information, including vehicle ID, charge status, etc., can be transmitted from the vehicles 6a, 6b to the controller 5 while the charge terminals 11, 12 do not intervene.

In such a case, the controller 5 needs to specify the charge terminal with which the vehicle 6a, 6b is connected among the charge terminals 11, 12. To that end, the charge terminal 11, 12 is designed to communicate with a vehicle connected with the charge terminal 11, 12 itself, for example. The charge terminal 11, 12 transmits an own port number to the vehicle; the vehicle transmits both the received port number and the own vehicle ID to the controller 5. In such a case, the charge terminals 11, 12 do not need to communicate with the controller 5.

In addition, in the wireless communications method, the controller 5 may receive the vehicle information etc. from a vehicle parked at a position other than the parking lot in which the charge apparatus 1 is installed. To prevent the above problem, the output range (strength, direction) of radio waves may be reduced to hardly detect a vehicle parked at another parking lot (for example, a parking lot of a next house). In addition, there may be a case that several vehicles including a vehicle parked at a different parking lot are detected. In such a case, the vehicle names and numbers of the detected vehicles may be displayed, thereby assisting a user not to register a wrong vehicle.

In addition, in the first embodiment, it is not necessary to specify the charge terminal connected to the vehicle associated with the short-press manipulated button. For example, at S225, the charge status request signal may be transmitted to all the charge terminals 11, 12. Then, out of the responded charge state information, the charge state information may be displayed with respect to only the vehicle having the vehicle ID associated with the short-press manipulated button.

In addition, the electric power supply system may not be used only at home. It may be used at an employee parking lot in a company or at a parking lot of a membership-based facility. That is, the electric power supply system according to the above embodiments can be applied to the case where one or more target vehicles that can receive an electric power supply are previously designated and a place where each target vehicle is parked is not fixed among several places in the parking lot (i.e., a charge terminal to which each target vehicle is connected is not fixed among several charge terminals).

The apparatus may be designed to be allowed only to start the charge. In such a case, in FIG. 10, S350 may be executed right after S220. In this case, a trigger condition for starting the charge is satisfied by only a short-press manipulation to A button or B button; in contrast, in the second embodiment, a trigger condition for starting the charge is satisfied by both a short-press manipulation of A button or B button (see S205) and a press of a button which needs to be pressed so as to start the charge (S350).

In addition, the controller 5 may be incorporated, for example, into a door phone, a hot-water supply apparatus, etc. as a part.

According to the above embodiments, the control section 55 performs the programs to implement the functions. The functions may be replaced by a hardware device having the equivalent functions. Such a hardware device includes an FPGA capable of programming a circuit construction.

Aspects of the disclosure described herein are set out in the following clauses.

As an aspect of the disclosure, a charge status display apparatus is provided for displaying a charge status of a battery of a vehicle, which is connected with one of a plurality of charge terminals, at a position distant from the charge terminals. Herein, each charge terminal is allowed to be connected with only one vehicle at one time; the each charge terminal supplies an electric power to the connected only one vehicle. The charge status display apparatus is provided by comprising the followings: a plurality of manipulation sections configured to receive a manipulation by a user; a readout section configured to read a correspondence table, which associates one of the manipulation sections with a vehicle ID, from a storage medium; a vehicle specification section configured to specify a vehicle ID associated with a first manipulation section out of the manipulation sections in the correspondence table, in a condition that the first manipulation section receives a first manipulation; an acquisition section configured to acquire charge status information on a charge status of a battery from a vehicle corresponding to the vehicle ID specified by the vehicle specification section out of vehicles, each of which connected with one of the charge terminals; and a display control section configured to cause a display section to display the charge status information acquired by the acquisition section.

As an optional aspect, the charge status display apparatus may further comprise an ID acquisition section and an association section. The ID acquisition section is configured to acquire a vehicle ID from a vehicle, which is connected with one of the charge terminals in a condition that the first manipulation section out of the manipulation sections receives a second manipulation, which is different from the first manipulation. The association section is configured to store the vehicle ID acquired by the ID acquisition section in the correspondence table in association with the first manipulation section.

Under such a configuration, the user connects a vehicle to a charge terminal, and then executes a second manipulation to the first manipulation section with which the vehicle, i.e., vehicle ID, should be registered. Thereby, the charge status display apparatus acquires a vehicle ID from the vehicle, and stores the acquired vehicle ID and the first manipulation section (e.g., button) in association with each other in the correspondence table. Thus, the user can associate a vehicle with the first manipulation section by a simple method to connect the vehicle with a charge terminal and execute a second manipulation to the first manipulation section.

As a further optional aspect of the above charge status display apparatus, the first manipulation may be a short-press manipulation which continues pressing for a duration less than a first reference period; and the second manipulation may be a long-press manipulation which continues pressing for a duration greater than a second reference period. Herein, at least the second reference period is not shorter than the first reference period.

According to another aspect of the disclosure, an electric power supply control apparatus is provided for controlling an electric power supply to a battery of a vehicle, which is connected with one of a plurality of charge terminals, at a position distant from the charge terminals. Herein, each charge terminal is allowed to be connected with only one vehicle at one time. The each charge terminal supplies an electric power to the connected only one vehicle. The electric power supply control apparatus is provided by comprising: a plurality of manipulation sections configured to receive a manipulation by a user; a read-out section configured to read a correspondence table, which associates one of the manipulation sections with a vehicle ID, from a storage medium; a vehicle specification section configured to specify a vehicle ID associated with a first manipulation section out of the manipulation sections in the correspondence table, in a condition that the first manipulation section receives a first manipulation; a terminal specification section configured to specify, out of the charge terminals, a charge terminal which the vehicle specified by the vehicle specification section is connected with; and an electric power supply start section configured to control such that an electric power supply is started in the charge terminal specified by the terminal specification section.

As an optional aspect of the electric power supply control apparatus, in case that the first manipulation section receives the first manipulation, when a vehicle corresponding to the vehicle ID, which is associated with the first manipulation section in the correspondence table, is connected to neither of the charge terminals, an electric power may be not supplied to a battery of a vehicle connected to any of the charge terminals.

For instance, there may be a case that while intending to charge a vehicle using the charge terminal without permission, someone connects the vehicle to the charge terminal to thereby wait for an authenticated user of the charge terminal to carelessly execute a manipulation for starting a charge. Even in such a case, as long as the vehicle ID of the vehicle is not associated with the first manipulation section in the correspondence table, the charge is thereby not executed to the vehicle.

As an optional aspect of the electric power supply control apparatus, in case that the first manipulation section receives the first manipulation, when a vehicle corresponding to the vehicle ID, which is associated with the first manipulation section in the correspondence table, is connected to neither of the charge terminals, a vehicle ID of a vehicle connected with one of the charge terminals may be stored temporarily in the correspondence table in association with the first manipulation section based on a permission manipulation by the user.

Under such a configuration, even if there is a vehicle (i.e., a not-registered vehicle) which is not previously assigned to or registered with the first manipulation section in the correspondence table, when a user (i.e., an authorized or registered user) executes a permission manipulation, a temporary association is made between the vehicle and the first manipulation section in the correspondence table, thereby allowing the charge control of the vehicle like the usual registered vehicle.

As an optional aspect, the electric power supply control apparatus may further comprise: an ID acquisition section configured to acquire a vehicle ID from a vehicle connected with one of the charge terminals in a condition that the first manipulation section out of the manipulation sections receives a second manipulation which is different from the first manipulation; and an association section configured to store the vehicle ID acquired by the ID acquisition section in the correspondence table in association with the first manipulation section.

Under such a configuration, when a user connects a vehicle with a charge terminal and then executes a second manipulation to the first manipulation section with which the vehicle should be registered. Thereby, the charge status display apparatus acquires a vehicle ID from the vehicle, and stores the acquired vehicle ID and the first manipulation section (e.g., button) in association with each other in the correspondence table. Thus, the user can associate a vehicle with the first manipulation section by a simple method to connect the vehicle with a charge terminal and execute a second manipulation to the first manipulation section.

As a further optional aspect of the above electric power supply control apparatus, the first manipulation may be a short-press manipulation which continues pressing for a duration less than a first reference period; and the second manipulation may be a long-press manipulation which continues pressing for a duration greater than a second reference period. Herein, at least the second reference period is not shorter than the first reference period.

As an optional aspect, the electric power supply control apparatus may further comprise the following two sections. A section may be configured to (i) specify a charge period from a start time to a stop time with respect to an electric power charge to a target vehicle connected to one of the charge terminals, (ii) calculate a supplied electric power amount and an electricity use fee according to the specified charge period, and (iii) store, in charge historical data, the calculated supplied electric power amount and the calculated electricity use fee along with a date of a day when the electric power charge is executed to the target vehicle. Another section may be configured to cause the display section to display a total of the electricity use fee in the charge historical data for a predetermined period in a condition that, out of the manipulation sections, a manipulation section with which a vehicle ID of the target vehicle is associated in the correspondence table is manipulated.

Under such a configuration, when the user executes a manipulation to a manipulation section associated with a vehicle of which an electricity use fee the user wants to display, the accumulated electricity use fee of the vehicle can be seen.

It will be obvious to those skilled in the art that various changes may be made in the above-described embodiments of the present invention. However, the scope of the present invention should be determined by the following claims.

What is claimed:

1. A charge status display apparatus for displaying a charge status of a battery of a vehicle, which is connected with one of a plurality of charge terminals, at a position distant from the charge terminals, each charge terminal with which only one vehicle is allowed to be connected at one time, the each charge terminal supplying an electric power to the connected only one vehicle, the charge status display apparatus comprising:

a plurality of manipulation sections configured to receive a manipulation by a user;

a read-out section configured to read a correspondence table, which associates one of the manipulation sections with a vehicle ID, from a storage medium;

a vehicle specification section configured to specify a vehicle ID associated with a first manipulation section out of the manipulation sections in the correspondence table, in a condition that the first manipulation section receives a first manipulation;

an acquisition section configured to acquire charge status information on a charge status of a battery from a vehicle corresponding to the vehicle ID specified by the vehicle specification section out of vehicles, each of which connected with one of the charge terminals; and a display control section configured to cause a display section to display the charge status information acquired by the acquisition section.

2. The charge status display apparatus according to claim 1, further comprising:

an ID acquisition section configured to acquire a vehicle ID from a vehicle, which is connected with one of the charge terminals in a condition that the first manipulation section out of the manipulation sections receives a second manipulation, which is different from the first manipulation; and an association section configured to store the vehicle ID acquired by the ID acquisition section in the correspondence table in association with the first manipulation section.

3. An electric power supply control apparatus for controlling an electric power supply to a battery of a vehicle, which is connected with one of a plurality of charge terminals, at a position distant from the charge terminals, each charge terminal with which only one vehicle is allowed to be connected at one time, the each charge terminal supplying an electric power to the connected only one vehicle, the electric power supply control apparatus comprising:

a plurality of manipulation sections configured to receive a manipulation by a user;

a read-out section configured to read a correspondence table, which associates one of the manipulation sections with a vehicle ID, from a storage medium;

a vehicle specification section configured to specify a vehicle ID associated with a first manipulation section out of the manipulation sections in the correspondence table, in a condition that the first manipulation section receives a first manipulation;

a terminal specification section configured to specify, out of the charge terminals, a charge terminal which the vehicle specified by the vehicle specification section is connected with; and an electric power supply start section configured to control such that an electric power supply is started in the charge terminal specified by the terminal specification section.

4. The electric power supply control apparatus according to claim 3, wherein in case that the first manipulation section receives the first manipulation, when a vehicle corresponding to the vehicle ID, which is associated with the first manipulation section in the correspondence table, is connected to neither of the charge terminals, an electric power is not supplied to a battery of a vehicle connected to any of the charge terminals.

5. The electric power supply control apparatus according to claim 3, wherein in case that the first manipulation section receives the first manipulation, when a vehicle corresponding to the vehicle ID, which is associated with the first manipulation section in the correspondence table, is connected to neither of the charge terminals, a vehicle ID of a vehicle connected with one of the charge terminals is stored temporarily in the correspondence table in association with the first manipulation section based on a permission manipulation by the user.

6. The electric power supply control apparatus according to claim 3, further comprising:

an ID acquisition section configured to acquire a vehicle ID from a vehicle connected with one of the charge terminals in a condition that the first manipulation section out of the manipulation sections receives a second manipulation which is different from the first manipulation; and an association section configured to store the vehicle ID acquired by the ID acquisition section in the correspondence table in association with the first manipulation section.

7. The electric power supply control apparatus according to claim 3, further comprising:

a section configured to specify a charge period from a start time to a stop time with respect to an electric power charge to a target vehicle connected to one of the charge terminals, calculate a supplied electric power amount and an electricity use fee according to the specified charge period, and store, in charge historical data, the calculated supplied electric power amount and the calculated electricity use fee along with a date of a day when the electric power charge is executed to the target vehicle; and a section configured to cause the display section to display a total of the electricity use fee in the charge historical data for a predetermined period in a condition that, out of the manipulation sections, a manipulation section with which a vehicle ID of the target vehicle is associated in the correspondence table is manipulated.

8. The charge status display apparatus according to claim 2, wherein:

the first manipulation is a short-press manipulation which continues pressing for a duration less than a first reference period; and the second manipulation is a long-press manipulation which continues pressing for a duration greater than a second reference period, which is not shorter than the first reference period.

9. The electric power supply control apparatus according to 6, wherein:

the first manipulation is a short-press manipulation which continues pressing for a duration less than a first reference period; and the second manipulation is a long-press manipulation which continues pressing for a duration greater than a second reference period, which is not shorter than the first reference period.

* * * * *